(12) United States Patent
Wachtler

(10) Patent No.: US 6,686,225 B2
(45) Date of Patent: Feb. 3, 2004

(54) METHOD OF SEPARATING SEMICONDUCTOR DIES FROM A WAFER

(75) Inventor: Kurt P. Wachtler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 09/917,534

(22) Filed: Jul. 27, 2001

(65) Prior Publication Data

US 2003/0022465 A1 Jan. 30, 2003

(51) Int. Cl.[7] .......................... H01L 21/44; H01L 21/48; H01L 21/50
(52) U.S. Cl. ....................... 438/114; 438/462; 438/465; 438/964; 438/977
(58) Field of Search ................................. 438/964, 113, 438/114, 462, 465, 977, FOR 387

(56) References Cited

U.S. PATENT DOCUMENTS

| | | | |
|---|---|---|---|
| 3,562,057 A | | 2/1971 | McAlister et al. |
| 4,047,286 A | * | 9/1977 | Lob et al. ................... 438/464 |
| 4,903,089 A | * | 2/1990 | Hollis et al. |
| 5,104,023 A | | 4/1992 | Nishiguchi et al. |
| 5,904,548 A | * | 5/1999 | Orcutt ........................ 438/462 |
| 6,074,896 A | * | 6/2000 | Dando ........................ 438/114 |
| 6,114,187 A | * | 9/2000 | Hayes ........................ 438/106 |
| 6,184,063 B1 | | 2/2001 | McKenna et al. |
| 6,184,064 B1 | * | 2/2001 | Jiang et al. .................. 438/113 |
| 6,215,172 B1 | | 4/2001 | Schoenfeld |
| 6,248,648 B1 | | 6/2001 | McKenna et al. |
| 6,278,181 B1 | * | 8/2001 | Maley ........................ 438/122 |
| 6,448,184 B1 | * | 9/2002 | Zimmer et al. ............. 438/706 |
| 6,605,520 B2 | * | 8/2003 | Cheong ...................... 438/592 |
| 6,607,970 B1 | * | 8/2003 | Wakabayashi .............. 438/462 |
| 2003/0143819 A1 | * | 7/2003 | Hedler et al. ............... 438/462 |

* cited by examiner

Primary Examiner—Olik Chaudhuri
Assistant Examiner—Khiem Nguyen
(74) Attorney, Agent, or Firm—W. Daniel Swayze, Jr.; W. James Brady; Frederick J. Telecky, Jr.

(57) ABSTRACT

Methods are disclosed for manufacturing semiconductor device dies and for separating dies from a semiconductor wafer, wherein one or more channels are etched in the top of the wafer between individual die areas. Material is then removed from the bottom side of the wafer in order to separate the individual dies. Methods are also disclosed for removing material from the bottom side of the wafer dies, wherein a contoured surface is provided on the die bottom, such as through an etching process. In addition, methods are disclosed for removing material from the bottom side of a wafer, and for securing a semiconductor device to a surface. Semiconductor wafers and dies are also disclosed having contoured bottom surfaces.

16 Claims, 14 Drawing Sheets

METHOD OF SEPARATING SEMICONDUCTOR DIES FROM A WAFER

FIELD OF INVENTION

The present invention relates generally to the art of semiconductor device manufacturing and more particularly to methods for fabricating and separating dies from a wafer in the manufacture of semiconductor devices.

BACKGROUND OF THE INVENTION

In the manufacture of semiconductor devices, such as integrated circuits (ICs), multiple devices and interconnections (e.g., circuits) are formed on a semiconductor wafer and then separated or singulated into individual parts or dies. This allows cost savings and reduced handling compared to forming the devices individually. The individual devices are located within corresponding die areas on the wafer with sufficient spacing provided between adjacent devices for subsequent separation operations and the manufacturing tolerances associated therewith. Typically, the devices are oriented in grid style on the wafer, with rows and columns of devices located on the top or front side of the wafer, wherein the devices are formed by multi-step processing involving selective deposition, removal, and/or doping of areas on the wafer surface to build electrical devices (e.g., transistors, diodes, resistors, capacitors, etc.) and connections therebetween.

Such devices may include integrated circuits, micro electro-mechanical structure (MEMS) devices, optical, opto-electronic, and other types of circuits. Photolithographic techniques are commonly employed in order to produce high density devices having hundreds, thousands, or millions of components with very small device feature sizes. Once the devices are created, the individual circuits on the wafer may be tested, after which the individual device dies are separated.

The wafers are typically back-ground through chemical mechanical planarization (CMP) or other material removal techniques, prior to die separation, wherein material is removed from the bottom or back side of the wafer, leaving a smooth bottom surface. The back-grinding is employed to provide dies having a desired final thickness, depending on the target application for which the dies are being produced. Separation of the individual tested dies from the wafer assembly is conventionally done by sawing or otherwise mechanically creating scribe lines such as channels or trenches extending completely through the wafer from the top side, which are located in the spacing or gaps between adjacent devices or die areas. In order to maintain the die in the row and column grid configuration, as well as to mechanically support the die during separation, a tape is applied to the bottom surface (and sometimes also to the top surface) of the wafer prior to the final separation step.

Once the individual dies are physically separated from one another, the dies can be removed from the tape, or alternatively, rows of taped components can be packaged for later provision to pick and place machinery. The semiconductor dies may then be assembled into integrated circuit chips, or may alternatively be secured directly onto printed circuit boards (PCBs), substrates, carriers, suspensions, or other mountings, wherein electrical connections are made to one or more electrically conductive bonding pads on the dies.

When employed in an integrated circuit chip, the semiconductor die is mounted onto a lead frame and wires are connected between lead frame leads and corresponding bonding pads on the die using a technique known as wire bonding. Wire bonding uses fine aluminum or gold wires (e.g., 25 $\mu$m in diameter), which are bound to the bonding pads through thermocompression bonding or ultrasonic bonding. Thermocompression bonding involves heating the die and the wire to a high temperature (e.g., about 250 degrees C.), and heating the tip of the wire to form a ball. A holding tool then forces the wire into contact with the bonding pad on the die. The wire adheres to the pad due to the combination of heat and pressure from the tool. The tool is then lifted up and moved in an arc to the appropriate position on the lead frame, while dispensing wire as required, where the process is repeated to bond the wire to the appropriate lead on the lead frame, except that a ball is not formed.

Ultrasonic bonding is sometimes used when the device cannot or should not be heated. The wire and bonding surface (e.g., a bonding pad on the die or a lead on the lead frame) are brought together by the tool, and ultrasonic vibration is used to compress the surfaces together to achieve the desired bond. Once the pads are appropriately connected to the lead frame leads, the lead frame is encapsulated in a ceramic or plastic integrated circuit package (e.g., with portions of the leads externally exposed), which may then be assembled onto a PCB by soldering the exposed leads onto corresponding conductive pads on the board.

Recently, Flip-Chip technology has become popular, wherein an individual semiconductor die is mounted directly to a substrate, PCB, suspension, flex-circuit or the like. Bumps (e.g., solder bumps, plated bumps, gold stud bumps, adhesive bumps, or the like) are added to the bonding pads of the die using a process known as bumping. For example, gold stud bumps are formed through a modified wire bonding technique. This technique makes a gold ball for wire bonding by melting the end of a gold wire to form a sphere. The gold ball is attached to the chip bond pad as the first part of a wire bond. To form gold bumps instead of wire bonds, wire bonders are modified to break off the wire after attaching the ball to the chip bond pad. The resulting gold ball, or "stud bump" remains on the bond pad and provides a permanent connection through the aluminum oxide to the underlying metal.

The bumping step is usually performed during wafer processing prior to separation of the individual die from the wafer. However, the gold stud bump process is applicable to individual single dies or to wafers. With stud bumps attached, the die or chip is then "flipped" over, with the bonding pads facing downward, and the bumps are attached to corresponding pads on the board using ultrasonic bonding techniques (hence the name "Flip-Chip"). This is typically done by locating the die face-down on the circuit board, and engaging the backside of the chip with an ultrasonic tool. Ultrasonic energy is then applied to the die, whereby an electrical and mechanical bond is formed between the bumps on the die, and the corresponding pads on the circuit board.

Such Flip-Chip applications have numerous advantages, including shorter circuit connections, lower noise susceptibility, and higher component density. Accordingly, Flip-Chip technology (sometimes referred to as direct chip attach (DCA) or chip-on-board) has been successfully employed in a variety of applications, including electronic watches, wireless telephones, pagers, high-speed microprocessors, hand-held and lap-top computers. Another important application where chips or semiconductor dies are mounted directly onto a circuit is in hard disk drives, wherein all or part of a pre-amp circuit associated with a read-write head is mounted onto a flexible circuit or suspension located just above the rotating disk media using chip-on-suspension (COS) techniques. Such a pre-amp circuit may be formed in a small, ultra-thin die (e.g., the die may need to be thin, in order to clear the rotating disk), which is mounted directly onto the suspension for electrically conditioning signals to or from the read-write head. The physical size of the suspension circuit calls for die profiles on the order of 1000 to 2000 $\mu$m, and thickness on the order of about 125 $\mu$m.

However, several problems arise in this and other applications, which conventional die fabrication and separation techniques either fail to adequately address, or may even exacerbate. One problem with existing saw cutting and other mechanical die separation techniques is wasted wafer space. Conventional spacing between adjacent die areas in a wafer is about 100 $\mu$m or more, to accommodate saw blade widths (e.g., about 25 $\mu$m or more), and the alignment inaccuracies associated with such mechanical cutting operations. Where small die are being manufactured (e.g., such as disk drive pre-amp die for a COS application), the relatively large spacing required for saw cut separation results in a large portion of the overall wafer space being unusable. In addition, many applications, such as disk drives, are susceptible to particles generated by the conventional back-grinding and saw cut separation operations. The saw cut and back-ground dies may be coated conformally in order to capture such particulate matter. However, this adds further processing steps and cost to the manufacturing process.

Additional particles may result from friction and slippage of ultrasonic tools engaging with the smooth bottom or back-side of the semiconductor dies, for example, during thermal-mechanical (e.g., ultrasonic) attachment of the die stud bumps to the corresponding pads on the suspension circuit. This tool slippage can create particles of silicon, which may break free and cause defects in the disk drive system. Moreover, the smooth bottom surface of conventional semiconductor dies provides minimal surface area to the ambient air flow around the die, resulting in less than optimal convection cooling capability for the part. Finally, conventional dies having bumps added to the input/output bonding pads, are susceptible to handling damage to the bumps. Consequently, there is a need for improved wafers, dies, and associated manufacturing and fabrication techniques, by which the above mentioned and other problems and shortcomings can be mitigated or avoided.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later. The invention relates to semiconductor apparatus and methodologies, which advantageously provide for improved device fabrication, separation, assembly, and operation, which finds utility in association with hard disk drives and other applications.

One aspect of the invention provides for creating slim channels or trenches between die areas in a semiconductor wafer, using a directional etch technique, such as reactive ion etching (RIE). The etched channels may be created lithographically, thereby freeing up the extra spacing between adjacent die areas previously wasted to account for mechanical alignment inaccuracy in saw-cut separating the dies. The etched channels, moreover, may be made much narrower than was possible using a saw blade. For instance, whereas conventional saw blades are about 25 $\mu$m wide or more, the etched channels can be made about 15 $\mu$m wide or less. Thus, whereas conventional spacing between adjacent wafer dies is typically 100 $\mu$m or more, the present invention allows die spacings as low as about 15 $\mu$m. This, in turn, reduces the wasted wafer space. For instance, in hard disk drive pre-amp circuit applications where small dies (e.g., with lengths and widths on the order of about 1000 to 2000 $\mu$m) are created, wafer utilization can be improved as much as about 10% through the reduced spacing between adjacent dies. Moreover, the use of chemical etching to create the channels between dies reduces or mitigates particulate matter previously associated with saw-cutting techniques.

Another aspect of the invention involves providing a contoured surface on the back or bottom side of the wafer, which may be employed in combination with the etched top side channels above, or with conventional saw-cut top side trenching techniques. The bottom side contoured surface may be accomplished by any suitable technique such as grinding or etching. Where a dry chemical etch technique is employed, the particles generated by conventional back-grinding can be avoided, and the removal of the bottom side material can be used to expose the etched or saw-cut top-side channels to achieve die separation or singulation. Furthermore, the provision of the contoured surface on the die bottom provides for exposure of greater die surface area to the ambient operating environment, thus facilitating improved convection cooling of the part. In addition, the contoured bottom surface may aid in reducing or avoiding particles generated during ultrasonic attachment of the die to the suspension or other circuit board. For instance, a contoured interface may be provided in an ultrasonic attachment tool, which cooperatively engages the contoured bottom surface of the die to reduce or mitigate slippage during application of ultrasonic energy.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
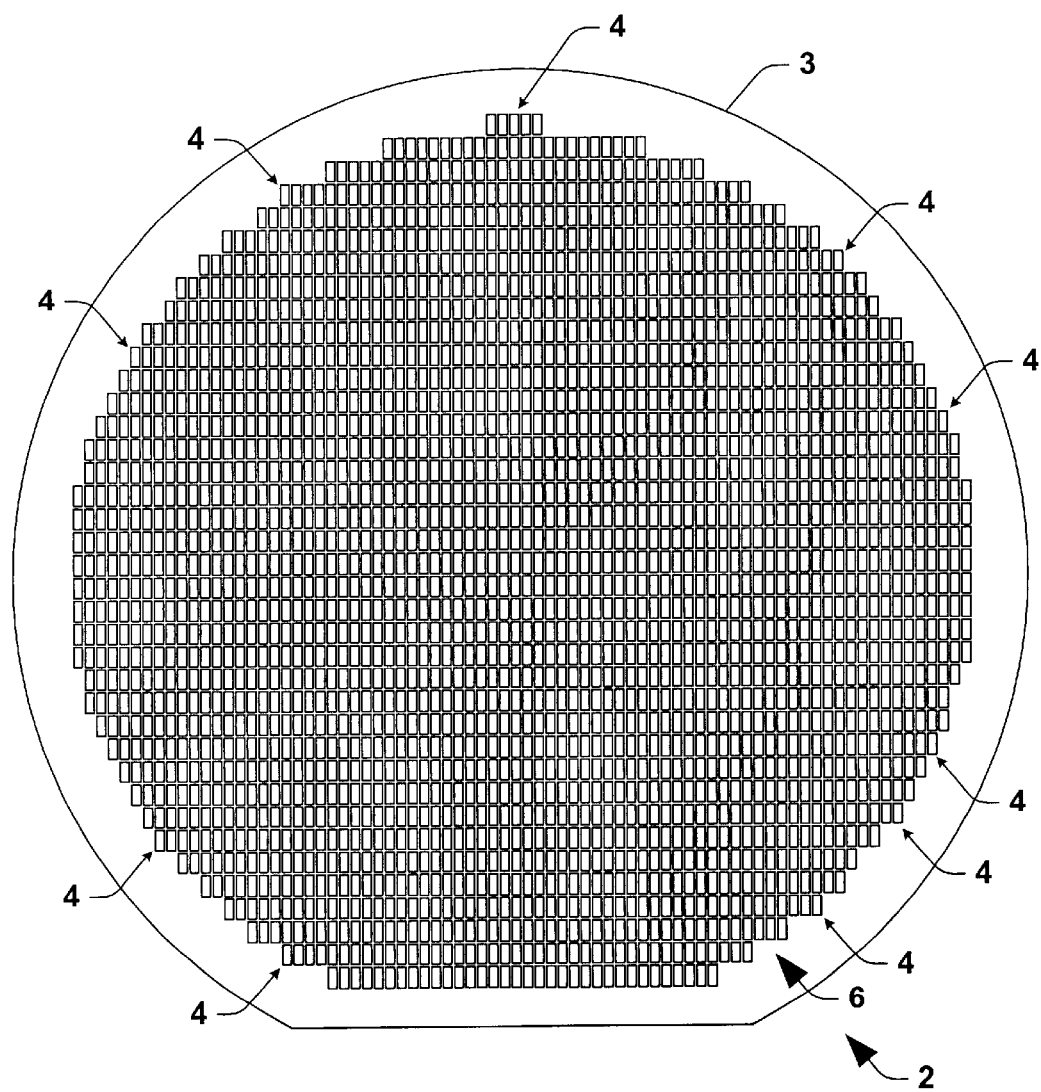
FIG. 1 is a top plan view illustrating a semiconductor wafer with a plurality of die areas in which separate electrical circuits may be formed.

The present invention will now be described with reference to the attached drawings, wherein like reference numerals are used to refer to like elements throughout. The invention relates to semiconductor apparatus and methodologies, which advantageously provide for improved device fabrication, separation, assembly, and operation, and which find utility in association with hard disk drives and other applications. Although illustrated and described hereinafter in association with dies for directly mounting on a suspension in chip-on-suspension (COS) fashion, it will be appreciated by those skilled in the art that one or more aspects and features of the invention find application in other situations. For instance, the invention may be applied to integrated circuit manufacturing generally, including but not limited to fabricating dies for direct mounting on boards, suspensions, substrates, carriers, flex circuits, and the like, as well as dies for assembly into integrated circuit chip packages.

Among other features, the invention provides for etching slim channels (e.g., about 15 $\mu$m wide) between die areas in a wafer, allowing die spacings as low as about 15 $\mu$m, and mitigating particulate problems found in the conventional separation methodologies. The invention also advantageously provides a contoured surface on the bottom side of the wafer to enhance thermal cooling of the die in operation. The contour may be created through patterned or selective etching, whereby particles typical of conventional backgrinding can be avoided or mitigated. The contour further provides for mitigation of particulates resulting from slippage during ultrasonic attachment of dies to circuit boards by facilitating engagement of the contour with a contoured interface on an ultrasonic attachment tool, as well as for improved convection cooling of the die.

Figure 2:
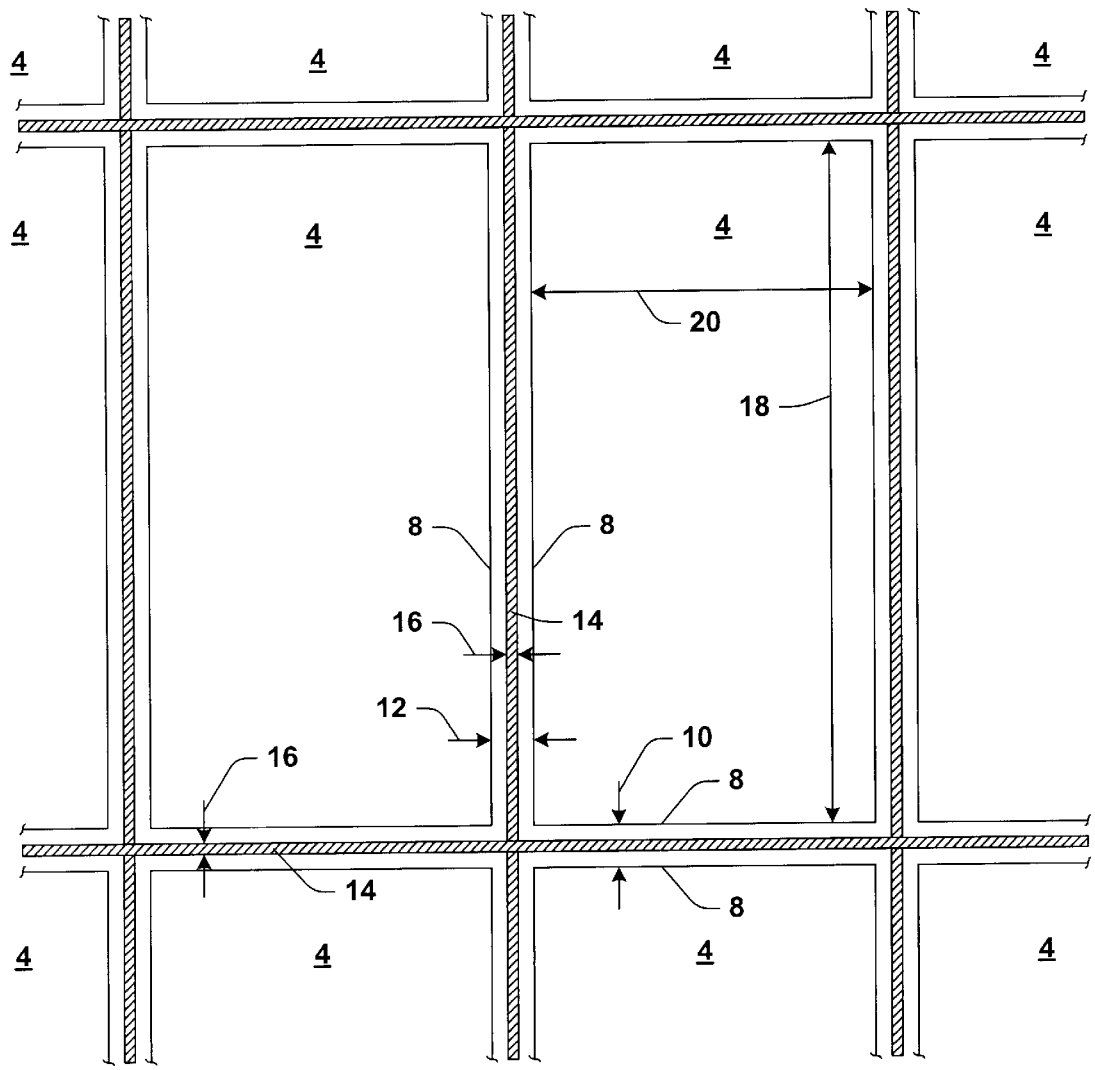
FIG. 2 is a top plan view of a portion of the wafer of FIG. 1 further illustrating several of the die areas and spacings therebetween, together with scribe lines cut into the spacings using conventional die separation techniques.

Referring initially to FIGS. 1 and 2, a semiconductor wafer 2 is illustrated comprising a substrate 3 with a plurality of die areas 4 located in rows and columns in the top side 6 of the wafer 2. The die areas 4 are illustrated having generally rectangular boundaries 8 within which individual electrical components and circuits are formed on the top side and within the wafer 2 according to known practices, wherein the die areas are spaced vertically and horizontally by spacings 10 and 12, which are typically around 100 $\mu$m or more. Scribe lines or channels 14 are saw cut into the spacings 10 and 12 to separate the individual dies 4 from the wafer 2. The scribe lines 14 commonly have a width 16 of 25 $\mu$m or more due to the width of conventional saw blades (not shown). In the illustrated wafer 2, the die areas 4 are employed for fabricating small COS circuits, such as hard disk drive pre-amp circuits having, for example, a length 18 of about 2000 $\mu$m and a width 20 of about 1000 µm. It will be appreciated that where devices of this size are being fabricated using wafer processing techniques for subsequent die separation, the relatively large spacings 10 and 12 between the die areas 4 result in less than optimal wafer space utilization.

Figure 3:
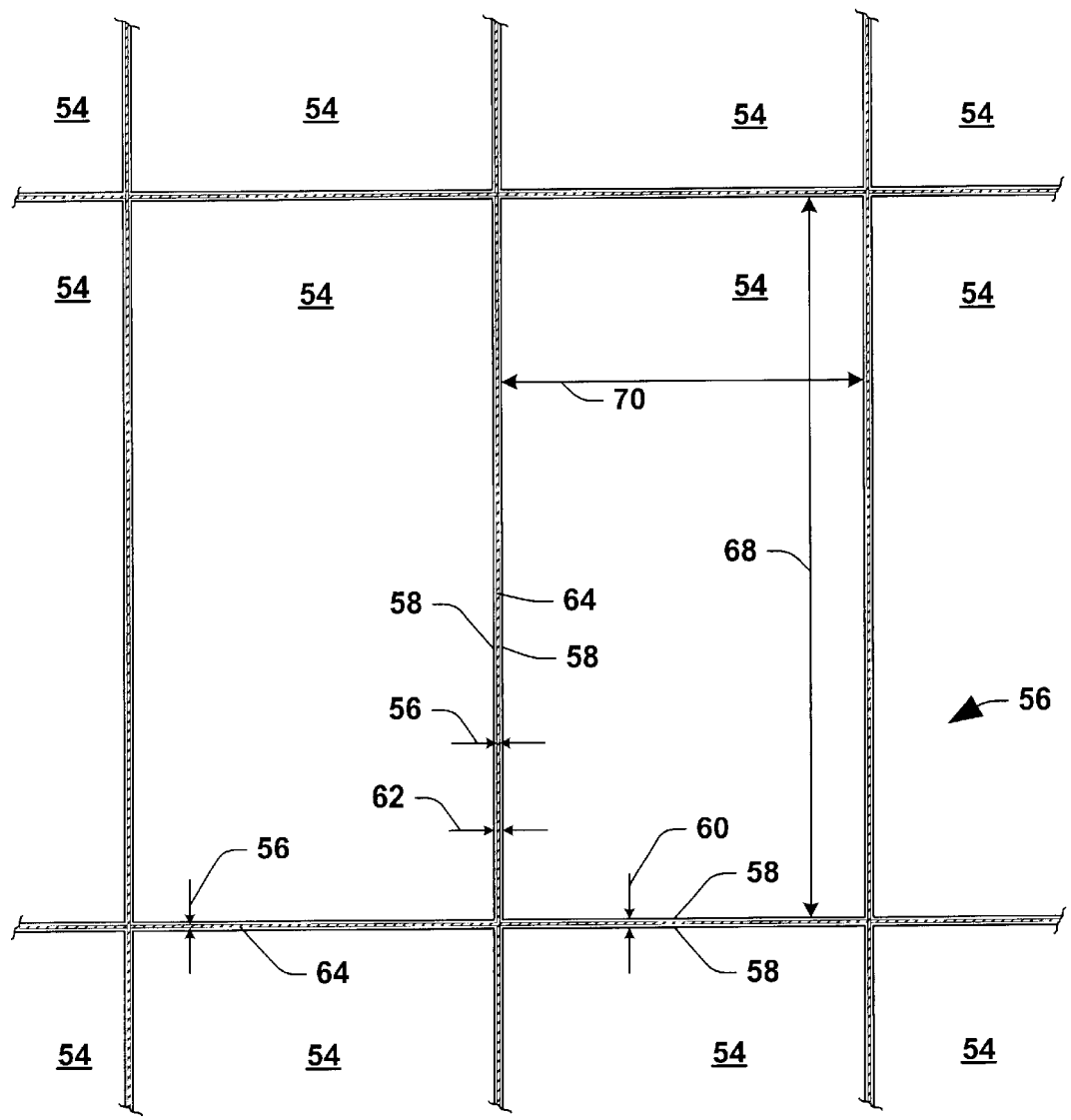
FIG. 3 is a top plan view of another wafer portion illustrating improved wafer space utilization achieved in accordance with an aspect of the present invention.

Referring now to FIG. 3, a portion of another wafer 52 is illustrated in accordance with the present invention, wherein die areas 54 illustrated by boundaries 58 have a length 68 of about 2000 µm and a width 70 of about 1000 µm, similar to the die areas 4 of FIGS. 1 and 2. Unlike the wafer 2 of FIGS. 1 and 2, however, the present invention facilitates improved wafer space utilization by the provision of narrow channels 64 having widths 56 as small as about 15 µm. The narrow channels 64 facilitate improved wafer utilization in the wafer 52 by allowing smaller spacings 60 and 62 between adjacent die areas 54 than was possible using conventional saw cut or other mechanical die separation techniques. For instance, the spacings 60 and 62 can be about 50 µm or less and in one implementation as small as about 15 µm.

In accordance with an aspect of the present invention, the channels 54 extend into the wafer 52 from a top side 56 toward a bottom side (not shown) between the die areas 54, and are formed using dry chemical etching. For instance, one implementation of the invention provides for removing material from the top side 56 to create the channels 64 using a directional plasma etch, such as reactive ion etching (RIE) to create channels having a width of about 15 µm or more with an aspect ratio (e.g., depth to width) of up to about 15:1. In the illustrated wafer 52, the channels 64 have a depth of about 130 µm or more and about 200 µm or less. RIE techniques comprise ion assisted etching which is anisotropic, where the etching is directional. The RIE involves chemical absorption of reactive molecules on the etched surface, impacting of ions on the surface, and physical disassociation of reaction by-products from the surface, which result in an anisotropic directional etch.

The etching process can employ photo-lithographic techniques, whereby the alignment inaccuracies inherent in the conventional mechanical saw cut scribe line approaches are avoided or mitigated, thereby allowing the spacings 60 and/or 62 to approach the channel widths 56. Also, the etching of channels 64 can provide channel widths 56 narrower than previously possible through mechanical sawing. For example, contemporary saw widths are 25 µm or more, whereas etching has been found to achieve channel widths as low as about 15 µm or less. Moreover, channel etching according to the invention advantageously mitigates or avoids particle generation, crack initiation sites and other associated problems inherent in saw cutting.

Figure 4:
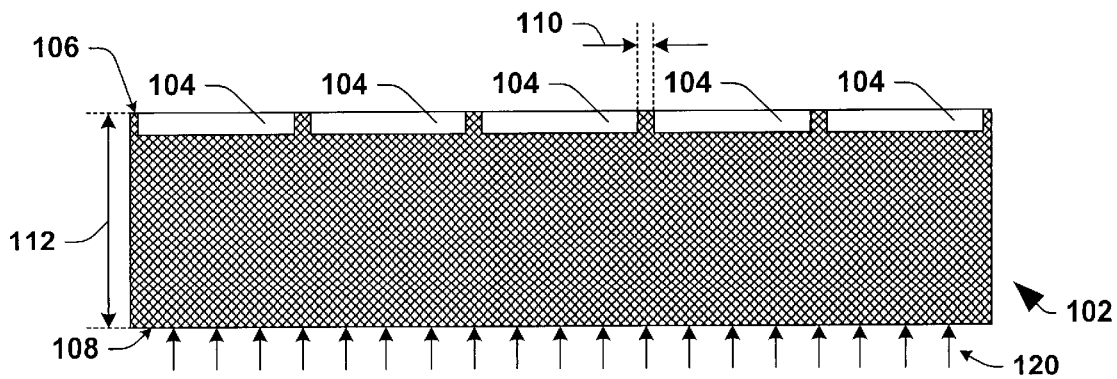
FIG. 4 is a sectional side elevation view illustrating a portion of an exemplary semiconductor wafer having individual die areas separated by a small distance according to an aspect of the invention, wherein the wafer is undergoing an initial operation to remove material from the wafer bottom side.

Referring now to FIGS. 4–9, one implementation of channel etching is illustrated in accordance with the present invention. In FIGS. 4–9, an exemplary wafer 102 comprises die areas 104 spaced from one another by spacings 110, which are about 50 µm or less in the wafer 102, and which can be as low as about 15 µm in accordance with the invention. Thus, as opposed to conventional spacings (e.g., 10 and 12 of FIG. 2) of 100 µm or more, the invention can thus be used to allow die spacings of 90 µm or less. As illustrated in FIG. 4, the wafer 102 comprises a top side 106 and a bottom side 108 with an initial thickness 112 of about 450 to 550 µm. The die areas 104 include electrical circuits or devices (not shown) formed in the areas 104 by known semiconductor processing techniques, and which may be tested prior to the operations illustrated and described hereinafter. The bottom side 108 of the wafer 102 is then subjected to an initial back-grind process 120, which may comprise mechanical grinding, etching or a chemical mechanical polish (CMP) process.

Figure 5:
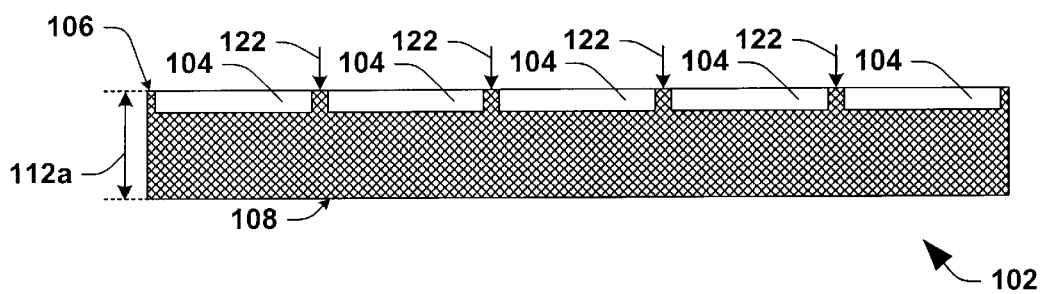
FIG. 5 is another sectional side elevation view illustrating the wafer of FIG. 4 undergoing an etch operation to provide channels on the top side thereof in accordance with an aspect of the invention.
Figure 6:
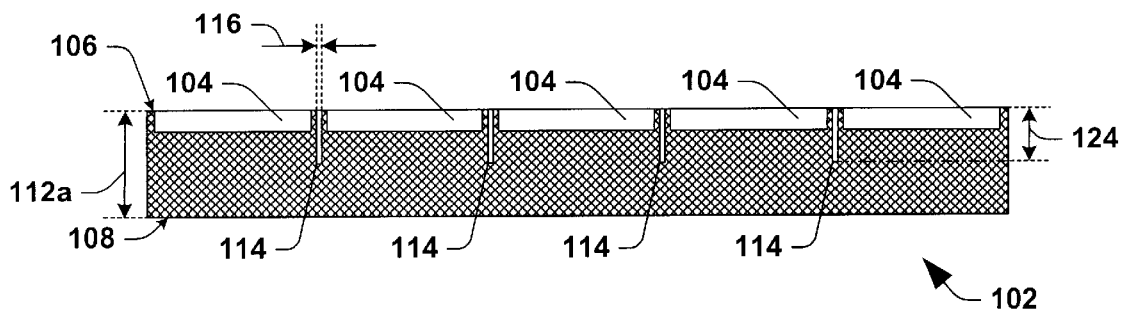
FIG. 6 is a sectional side elevation view illustrating the wafer of FIGS. 4 and 5, having etched channels extending downward from the top side and separating the die areas.

Referring now to FIGS. 5 and 6, the back-grind operation 120 yields an intermediate wafer thickness 112a of about 150–250 µm. Thereafter, the wafer 102 is subjected to a directional dry etch process 122, such as a reactive ion etch (RIE) to remove material from the top side 106 in the spacings 110 between the die areas 104. The reactive ion etch 122 yields channels 114 having widths 116 as small as about 15 µm, where the channels 114 extend downward from the top side 106 toward the bottom side 108 to reach a depth 124 of about 130 µm, for example. The channels 114 are thus created in the wafer 102 between the individual die areas 104 without generating particles typical with the use of saw cutting. Moreover, the etching process 122 suffers from significantly less alignment accuracy problems than do mechanical (e.g., sawing) techniques. It will be appreciated that the initial back-grind process 120 of FIG. 4 can alternatively be performed subsequent to the formation of the channels 114 via the etch process 122, for example, where the material removal of the process 120 does not cause significant wafer breakage.

Figure 7:
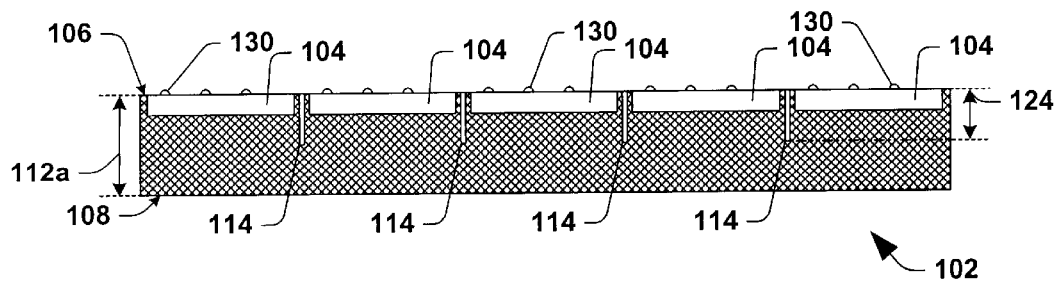
FIG. 7 is a sectional side elevation view illustrating the wafer of FIGS. 4–6, having etched channels and stud bumps extending upwardly from the die areas.

As illustrated in FIG. 7, one or more bumps 130, such as gold stud bumps, are next applied to the top side 106 in the die areas 104 using known wafer bumping techniques, in order to provide for electrical connection between the circuits of the die areas 104 and other circuitry, such as circuit boards, suspensions, flex circuits, and the like. A tape 132 is then added to the top side 106 of the wafer 102 in FIG. 8, where the tape 132 comprises a carrier 134 layer 7 and an adhesive layer 136. The tape 132 fixes the relative location of the individual die areas 104 in subsequent die separation operations, as illustrated and described in greater detail hereinafter.

Figure 9:
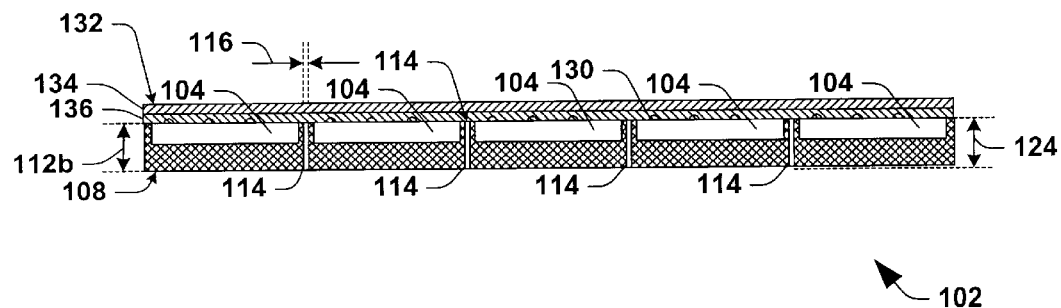
FIG. 9 is a sectional side elevation view illustrating the wafer of FIGS. 4–8, with material removed from the bottom side thereof so as to expose the channels and to separate individual dies.

The wafer 102 is then subjected to a back-grind operation 140 to remove further material from the bottom side 108, resulting in a final wafer thickness 112b of about 125 µm as illustrated in FIG. 9. The process 140 can be any type of material removal operation suitable for semiconductor devices, such as grinding or etching, whereby the channels 114 are exposed through the bottom side 108 (e.g., the final wafer thickness 112b is less than the original channel depth 124), thus separating or singulating the individual dies. Thereafter, the individual dies may be assembled into integrated circuit (IC) chip packages using wire bonding, or installed directly onto a circuit board, suspension, or the like using ultrasonic attachment techniques.

Referring now to FIGS. 10–23, another aspect of the invention involves creating a contoured bottom or back surface on a semiconductor die or wafer, which may be done using mechanical material removal techniques (e.g., grinding, cutting, etc.) or through etching operations. In particular, the use of selective etching provides such a contoured bottom surface while mitigating particle generation and the problems associated with mechanical techniques. The contoured bottom wafer surface provides better convection cooling than a smooth surface, which improves circuit performance in such applications as hard disk drive pre-amp booster pumps where the die is mounted directly on a suspension (COS), and other Flip-Chip type assemblies.

The etching of the contoured bottom surface may also be used to separate individual dies from a wafer, for instance, where the bottom-side etch exposes the top side channels between adjacent die areas. In addition, a mating contoured surface can be provided in ultrasonic die attachment tooling for mounting the die on the suspension (e.g., or other circuit board), wherein the engagement of the contoured surfaces mitigates slipping between the tooling and the die, and the associated particle generation. The provision of the contoured bottom surface, moreover, can be employed in association with the above mentioned etched channels, in order to provide die creation and separation substantially free of troublesome particles.

Figure 8:
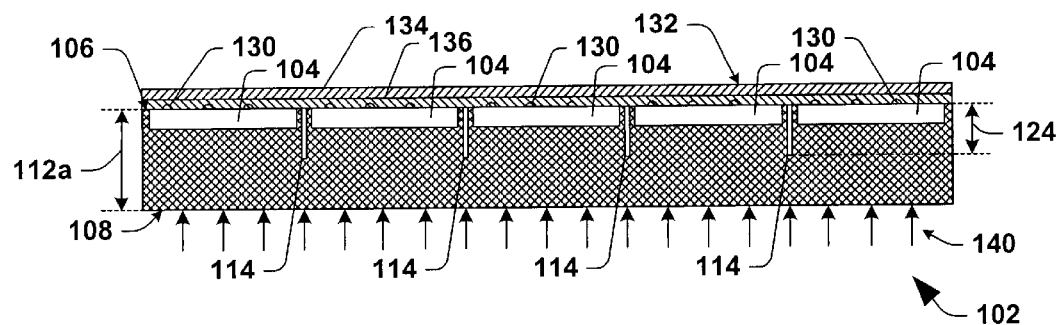
FIG. 8 is a sectional side elevation view illustrating the wafer of FIGS. 4–7, with tape covering the top side and undergoing an etch operation to remove material from the bottom side thereof.
Figure 10:
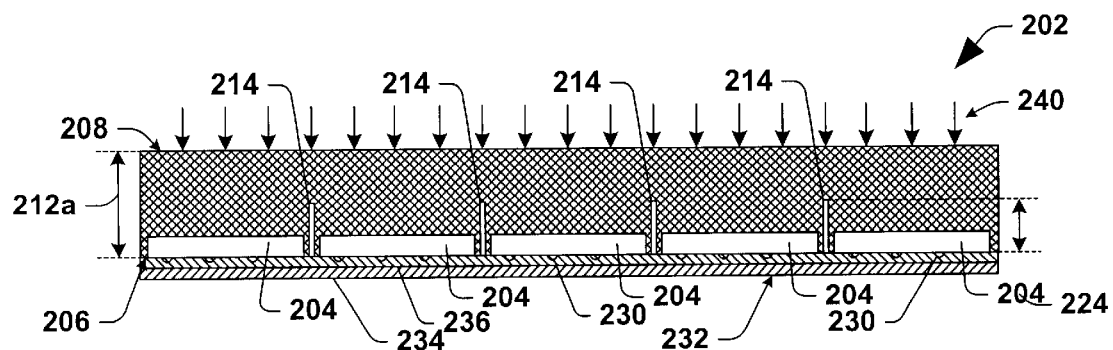
FIG. 10 is an inverted sectional side elevation view illustrating the wafer of FIGS. 4–8 undergoing an intermediate bottom side material removal operation.

In FIG. 10, a portion of an exemplary wafer 202 is illustrated, which is similar in structure to the wafer 102 of FIGS. 7 and 8. The wafer 202 comprises a plurality of die areas 204 having electrical circuits and/or components (not shown) formed therein at a top or front side 206. Channels 214 are provided, which extend from the top side 206 toward a bottom or back side 208 in between the adjacent die areas 204, wherein the channels 214 have a depth 224 (e.g., about 130 to 150 μm) which is less than an initial thickness 212a of the wafer 202. The channels 214 may be etched as described above using a directional dry etch process, such as reactive ion etching (RIE), or may be provided by any appropriate techniques.

However, as discussed above, it will be appreciated that etching the channels 214 advantageously provides for mitigation of particle generation in the fabrication process compared to conventional saw cutting methodologies. Bumps, such as gold stud bumps 230 are provided on the top side 206 of the die areas 204, in order to provide for electrical interconnection to the circuits in the die areas 204. A tape 232 is mounted on the top side 206 covering the stud bumps 230 and the die areas 204 with a carrier layer 234 and an adhesive layer 236, in order to secure the individual dies in spatial relation to one another after die separation.

Figure 11:
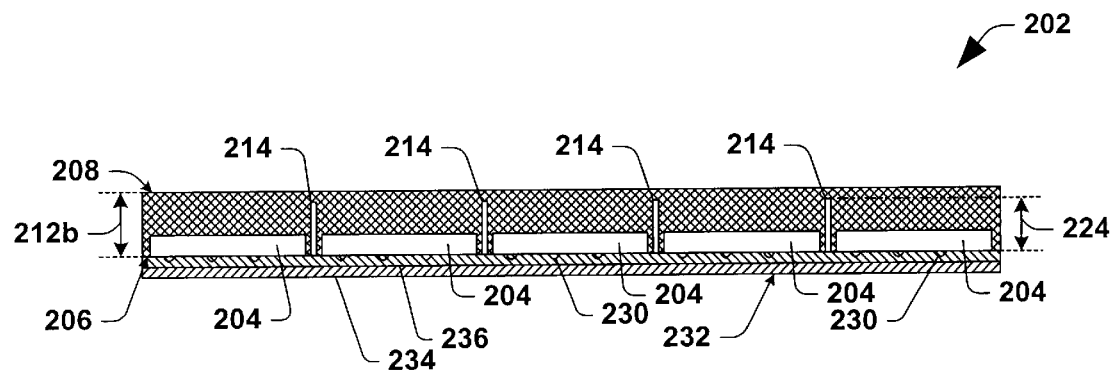
FIG. 11 is a sectional side elevation view illustrating the wafer of FIG. 10 after material has been removed from the bottom side thereof.
Figure 12:
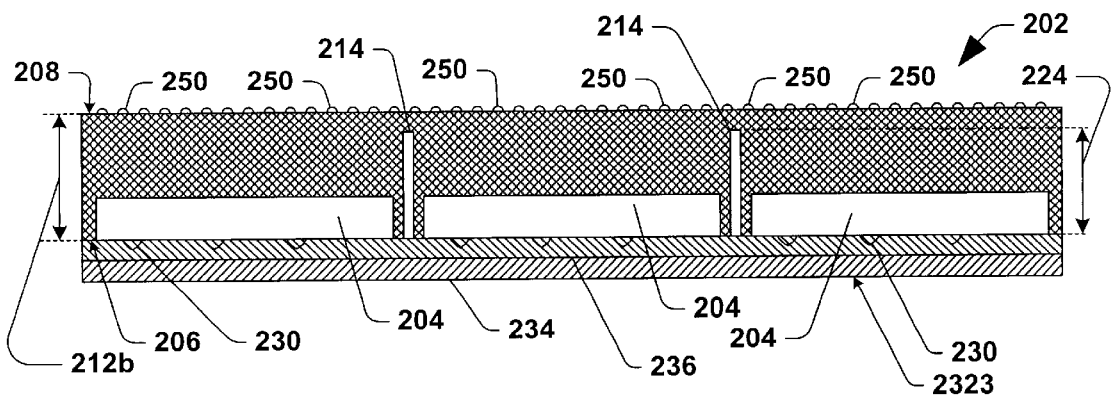
FIG. 12 is a sectional side elevation view illustrating the wafer of FIGS. 10 and 11 with a dot pattern of polymer droplets disposed on the bottom side in accordance with another aspect of the invention.
Figure 23A:
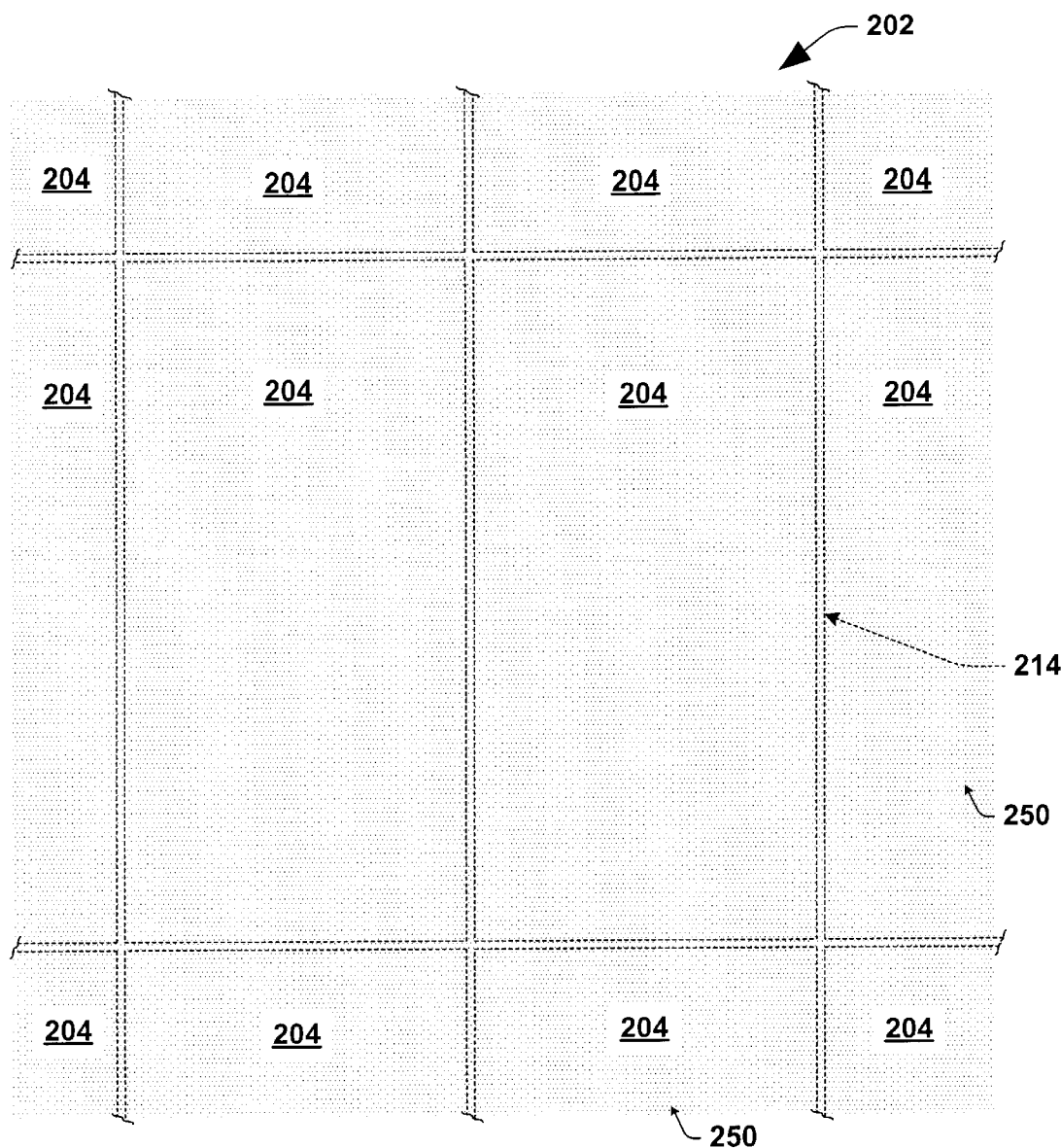
FIGS. 23a and 23b are bottom plan views illustrating an exemplary dot pattern for providing a contoured bottom surface in accordance with the invention.
Figure 23B:
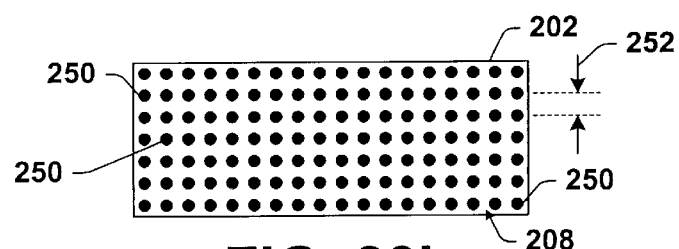

As illustrated in FIG. 10, an initial bottom-side etch operation 240 is performed on the bottom side 208 to provide a wafer thickness 212b as illustrated in FIG. 11. Thereafter, as shown in FIG. 12, a pattern of dots 250 is applied to the bottom side 208, wherein the dots 250 comprise a material typically having an etch rate lower than that of the wafer 202. For example, the dots may be a polymer material jetted onto the bottom surface 208 in any appropriate pattern and shape according to the desired contoured bottom surface. It will be noted at this point that any appropriate etch resistant material can be used, having an etch rate which may, but need not, be lower than that of the wafer 202, wherein the contoured surface resulting from the selective etching results from the combination of the etch rate and the thickness thereof. For instance, where the dot material 250 is very thick relative to the desired etching on the silicon wafer 202, a material with a faster etch rate may be employed for the dots 250. Referring also to FIGS. 23a and 23b, the dots 250 may be circular, and disposed in a row and column pattern on the bottom surface 208 with a spacing or pitch 252 of about 25 μm in the illustrated implementation. Any appropriate pattern and shape can be employed in accordance with the invention, whereby selective etching of the bottom side 208 may yield a contoured bottom surface 280, including patterns, spacings, dot sizes and shapes apart from those illustrated and described herein.

Figure 13:
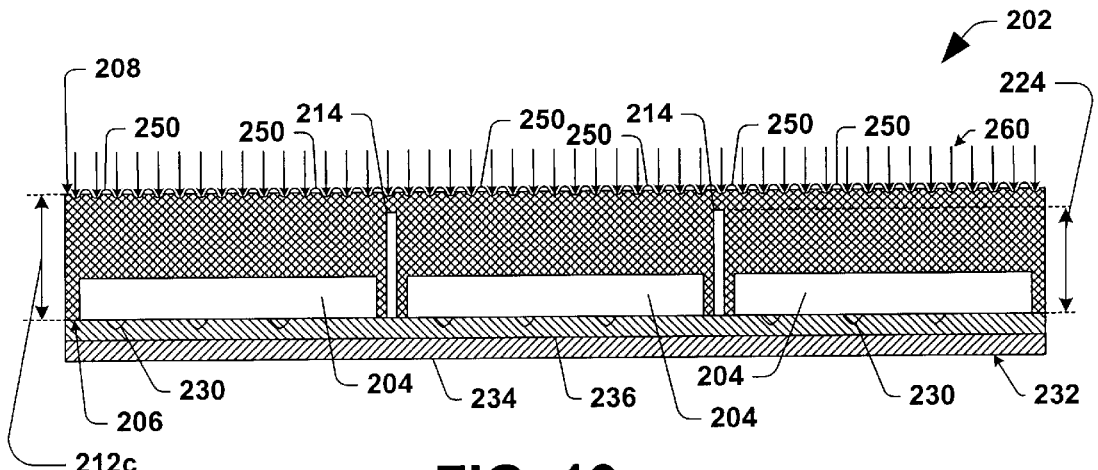
FIG. 13 is a sectional side elevation view illustrating the wafer of FIGS. 10–12 undergoing a selective sacrificial bottom-side etch operation according to the dot pattern for removing material from the bottom side and creating a contoured bottom surface in accordance with another aspect of the invention.
Figure 14:
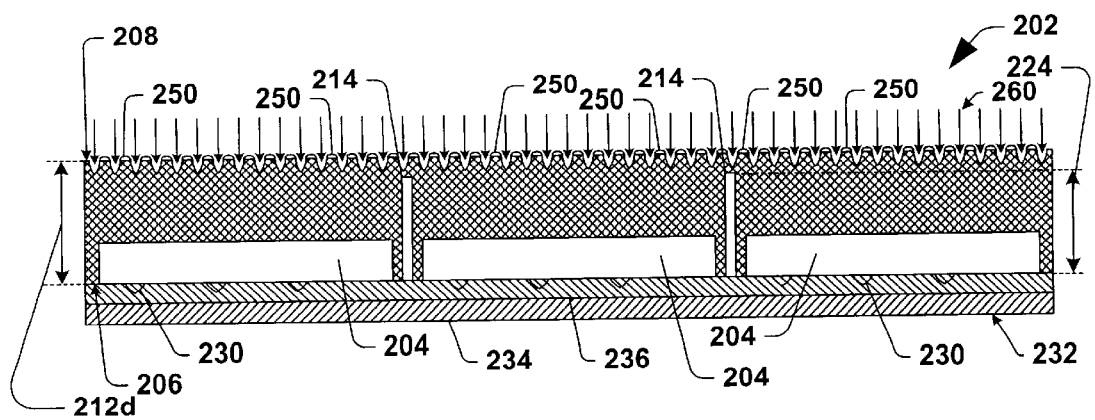
FIG. 14 is a sectional side elevation view illustrating the wafer of FIGS. 10–13 undergoing further sacrificial bottom-side etching for creating a contoured bottom surface associated therewith.
Figure 15:
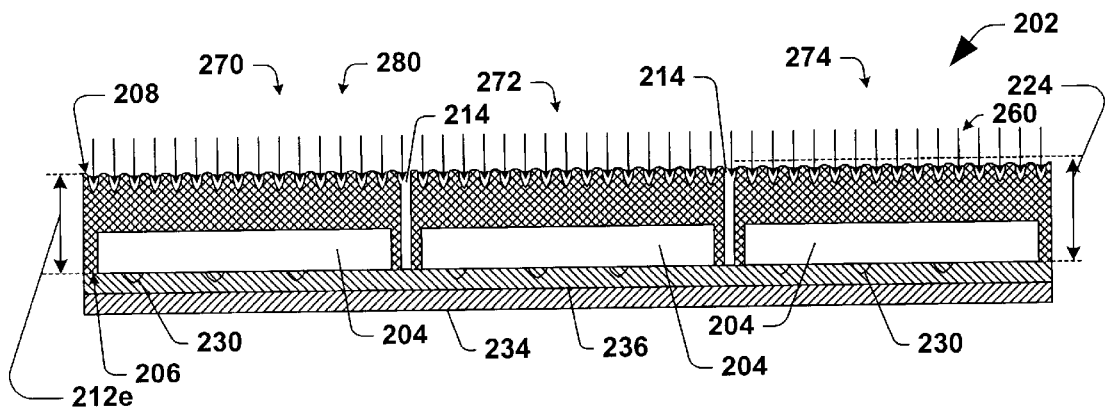
FIG. 15 is a sectional side elevation view illustrating the wafer of FIGS. 10–14 undergoing further sacrificial bottom-side etching for creating a contoured bottom surface and exposing the channels to separate the individual dies.
Figure 16:
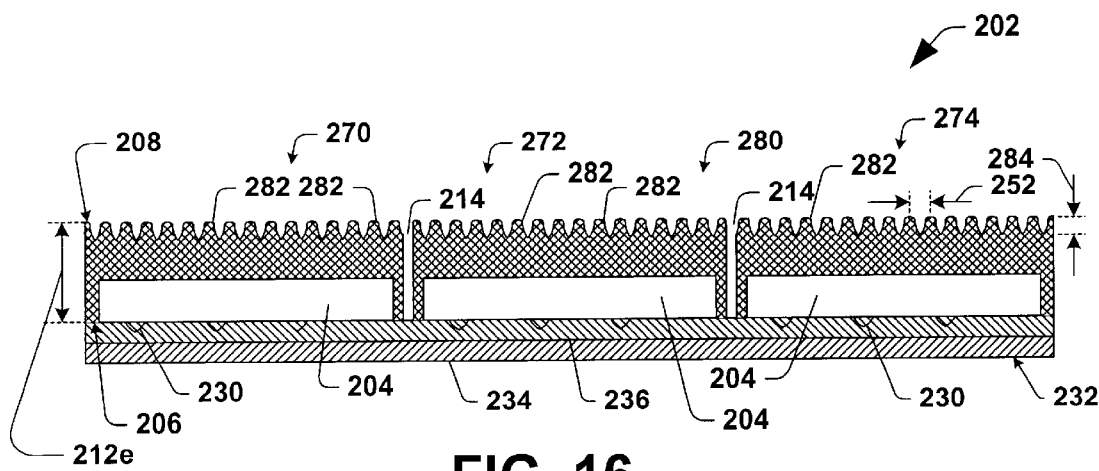
FIG. 16 is a sectional side elevation view illustrating the wafer of FIGS. 10–15 with a contoured bottom surface on the singulated semiconductor dies.

Once the pattern of dots 250 is applied (e.g., through jetting or photo-lithographic techniques), an etch operation 260 is performed on the bottom side 208 as illustrated in FIGS. 13–15, wherein the wafer thickness is gradually reduced from 212b (FIG. 12) to 212c, 212d, and finally to 212e, as shown in FIGS. 13–15, respectively. The combination of the etch rate of the substrate material (e.g., silicon) of wafer 202, and the, etch rate and shape of the dots 250 provides for contouring of the bottom side 208 through sacrificial etching via the operation 260, where the dots 250 are completely etched away when the final wafer thickness 212e is reached, and wherein the final thickness 212e is less than the original channel depths 224. In this manner, the selective etch process 260 provides a contoured surface 280 having contoured convex shapes 282 of height 284 and spacings 252 on the bottom side 208, at the same time as exposing the channels 214 to separate individual dies 270, 272, and 274 from one another, as illustrated in FIGS. 15 and 16.

Figure 20:
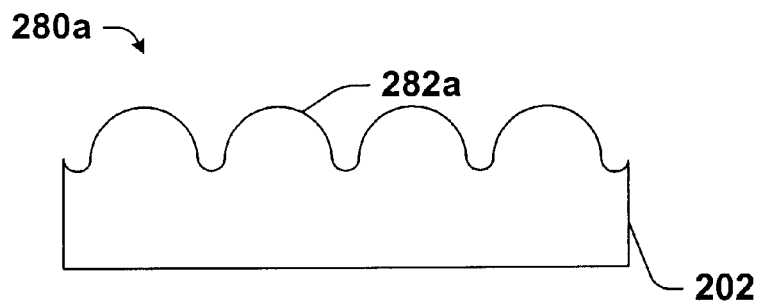
FIG. 20 is a side elevation view illustrating a portion of a semiconductor die with another exemplary contoured bottom surface in accordance with an aspect of the invention.
Figure 21:
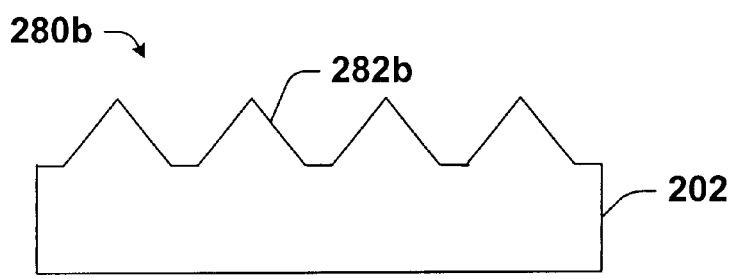
FIG. 21 is a side elevation view illustrating a portion of another semiconductor die with another exemplary contoured bottom surface.
Figure 22:
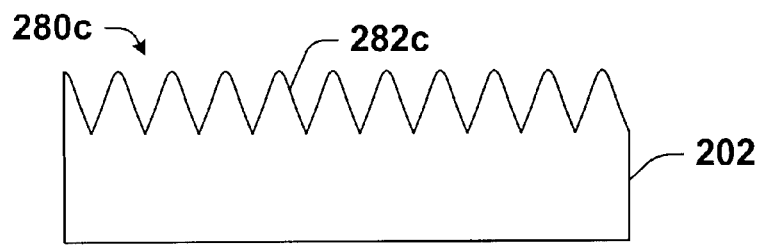
FIG. 22 is a side elevation view illustrating a portion of another semiconductor die with another exemplary contoured bottom surface.

The pattern (e.g., size, shape, spacings, pattern, thickness, profile, etc.) of the dots 250 can thus be selected, as well as the etch rate of dots 250, and the process parameters associated with the selective etching 260, in order to provide a variety of different contoured surfaces 280 on the bottom side 208. Referring briefly to FIGS. 20–22, many different contoured surfaces 280 may be provided in accordance with the invention, including but not limited to surfaces 280a, 280b, and 280c of FIGS. 20–22, respectively, having convex contour features or shapes 282a, 282b, and 282c. For instance, the shapes 284 can comprise conical shapes, semi-spherical shapes, or any other convex shape.

It will be further appreciated that the contoured surface 280 may include contoured shapes 282 in a variety of patterns, spacings, pitches, etc., whereby interface with assembly tooling and convection cooling may be achieved according to specific design goals for a given semiconductor die product. In this regard, the contoured convex shapes and patterning can be selected, for example, according to one or more design criteria, such as to maximize surface area with respect to convection cooling, and/or to minimize airflow resistance and associated vibration effects (e.g., such as in a hard disk drive application where air flow proximate a rotating disk media can cause vibration of one or more system components, which can be reduced using the contoured surface 280 of the pre-amp booster pump circuit die).

The etch process 260 can be any commercially available chemical dry etch process, whereby the pattern of dots 250 and the etch process 260 can be controlled in order to effectuate the desired final contour. Moreover, the process 260 can be continued after initial exposure of the channels 214, so as to provide for a radius or bevel on the edges of the exposed channels 214, in order to mitigate stress points and reduce cracks in the dies 270, 272, and 274. Furthermore, the etch process 260 can be a non-directional etch operation, whereby contouring of the bottom side 208 may be facilitated by the sacrificial removal of the material of wafer 202 and the droplets or dots 250. It will be noted at this point, that although the wafer 202 is illustrated being contoured via selective etching of the bottom side 208 via dots 250 and the etch operation 260, that a contoured surface 280 can be provided on the bottom side 208 through other means in accordance with the invention. For example, a contoured surface 280 may be ground into the bottom side 208 to provide for advantageous convection cooling improvement, and interfacing with ultrasonic tooling in accordance with the present invention.

Figure 17:
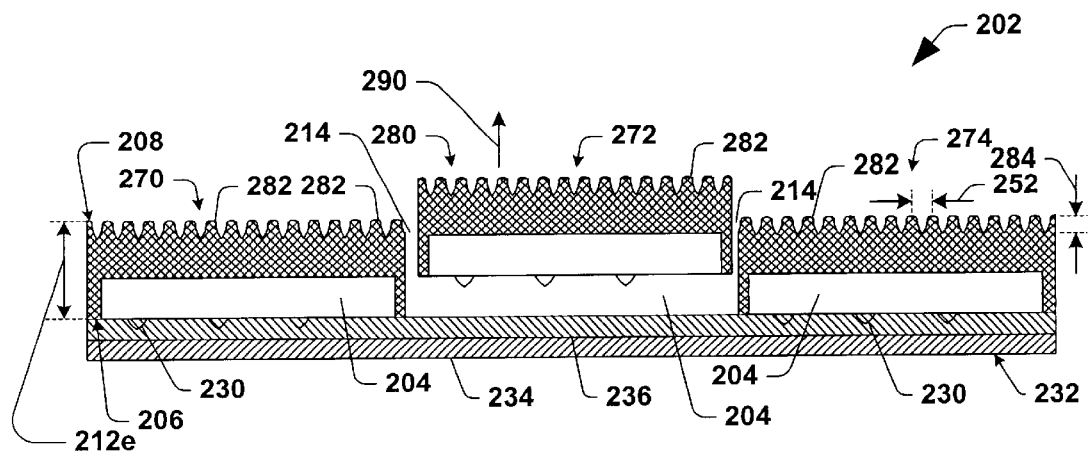
FIG. 17 is a sectional side elevation view illustrating the wafer of FIGS. 10–16 with a singulated die being removed from the tape.
Figure 18:
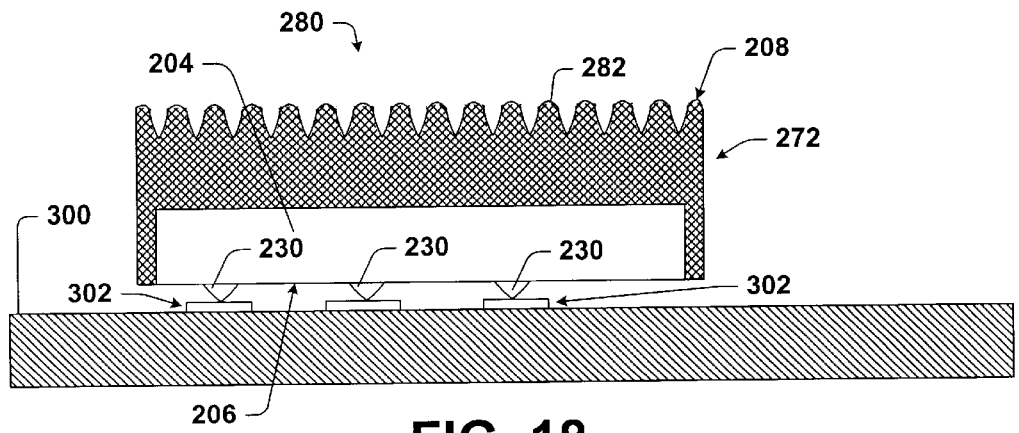
FIG. 18 is a sectional side elevation view illustrating the singulated semiconductor die of FIG. 17 located on a circuit board or suspension.

As illustrated in FIG. 16, once the final desired die thickness 212e has been achieved, and the channels 114 have been appropriately exposed from the back or bottom side 208 of the wafer 202, an individual semiconductor die 272 can be removed from the tape 232 by a pick and place tool (not shown) in the direction of arrow 290 in FIG. 17 for assembly into an integrated circuit package with a lead frame (not shown) or directly onto a circuit board, carrier, suspension, or other circuit. As illustrated in FIG. 18, the die 272 is located on a circuit board 300 with the stud bumps 230 aligned with corresponding bonding pads 302 on the board 300.

Figure 19:
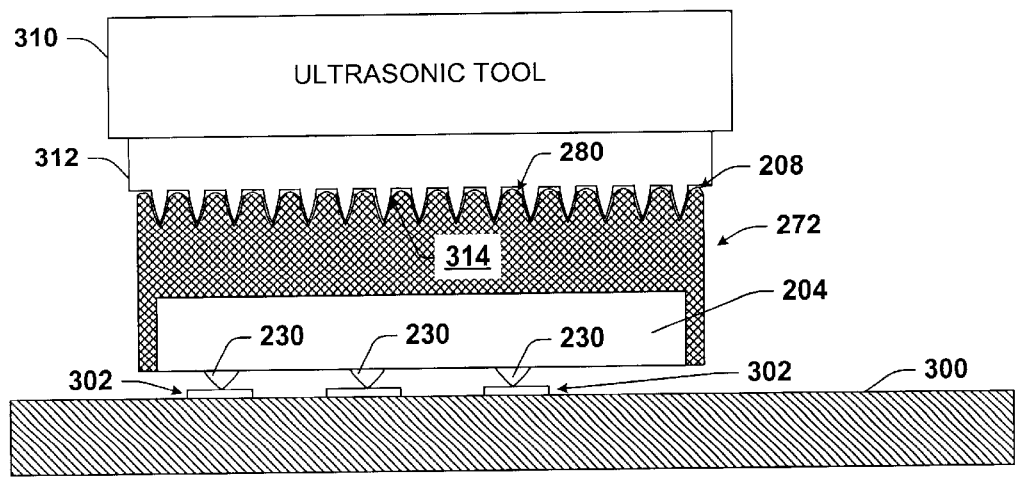
FIG. 19 is a sectional side elevation view illustrating the singulated semiconductor die of FIGS. 17 and 18 and an ultrasonic tool with a contoured interface providing energy to attach the stud bumps of the die to the circuit board.

Referring also to FIG. 19, an ultrasonic assembly tool 310 is then brought into engagement with the bottom side 208 of the die 272 using a contoured interface 312 having a contoured interface surface 314, wherein the surface 314 cooperatively interengages with the contoured bottom surface 280 of the die 272. Ultrasonic energy may then be transferred from the tool 310 to the die 272 to effect a mechanical and electrical connection of the stud bumps 230 of the die 272 with the pads 302 of the board 300. It will be appreciated that the engagement of the contoured surfaces 314 and 280 advantageously mitigates particle generation during attachment of the die 272 to the board 300 according to this aspect of the invention, and further that the contoured bottom surface 280 of the die 272 provides for improved convection cooling capability for the die 272 once assembled onto the board 300.

Figure 24:
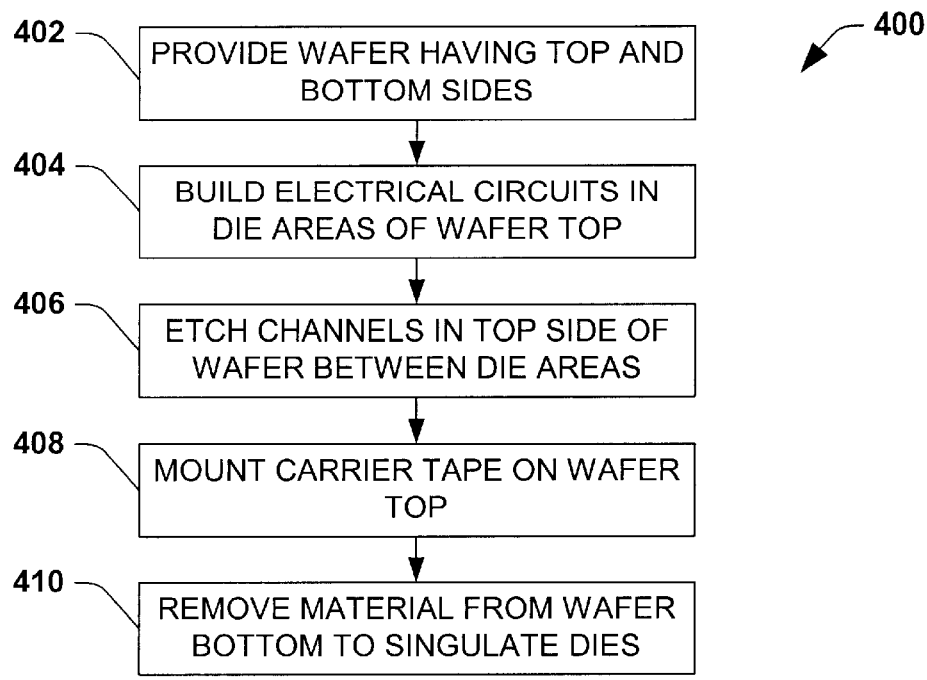
FIG. 24 is a flow diagram illustrating an exemplary method of separating wafer dies in accordance with another aspect of the invention.

Another aspect of the invention provides methods for producing and separating wafer dies. One exemplary die separation method 400 is illustrated in FIG. 24 in accordance with the present invention. While the exemplary method 400, and other methods of the invention are hereinafter illustrated and described as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the method 400 and other methods of the invention may be implemented in association with the apparatus and systems illustrated and described herein as well as in association with other systems not illustrated.

At 402, a wafer is provided with top and bottom sides, and electrical circuits are created in individual die areas of the wafer at 404. The circuits can be created using known semiconductor wafer processing fabrication techniques, such as photo-lithography, deposition, etching, ion implantation, or the like, by which electrical devices (e.g., transistors, resistors, capacitors, and connections) can be formed in the wafer. At 406, channels are etched in the top side of the wafer between adjacent die areas. The channels etched at 406 extend into the wafer from the top side toward the bottom side, through removal of material from the top side of the wafer using a dry chemical etch process. For example, a directional plasma etch process, such as reactive ion etching (RIE) can be employed at 406 to create channels having a width of about 15 $\mu$m or more, and a depth of about 130 $\mu$m or more and about 200 $\mu$m or less in one implementation.

A carrier tape is then mounted onto the channeled top side of the wafer at 408. The tape fixes the relative location of individual dies in the wafer with respect to one another during subsequent die separation. In addition, where the die areas have bumps (e.g., gold stud bumps or other types of bumps) on the top side, the tape provides mechanical support and protection of the bumps during subsequent handling. Thereafter at 410, material is removed from the bottom or back side of the wafer so as to separate or singulate individual dies. For instance, the removal of material at 410 can comprise exposing the top side channels to separate adjacent dies from one another. The dies can then be removed from the tape for assembly into circuits or integrated circuit packages. The removal of bottom side material at 410, moreover, can be accomplished by any appropriate techniques, such as etching, grinding, or the like. It will be appreciated that the etching of channels at 406 provides for avoidance or mitigation of the particulate matter generated by conventional saw cut channels, and that the material removal at 410 can advantageously be performed using etching techniques in order to avoid or mitigate the same problems.

Figure 25:
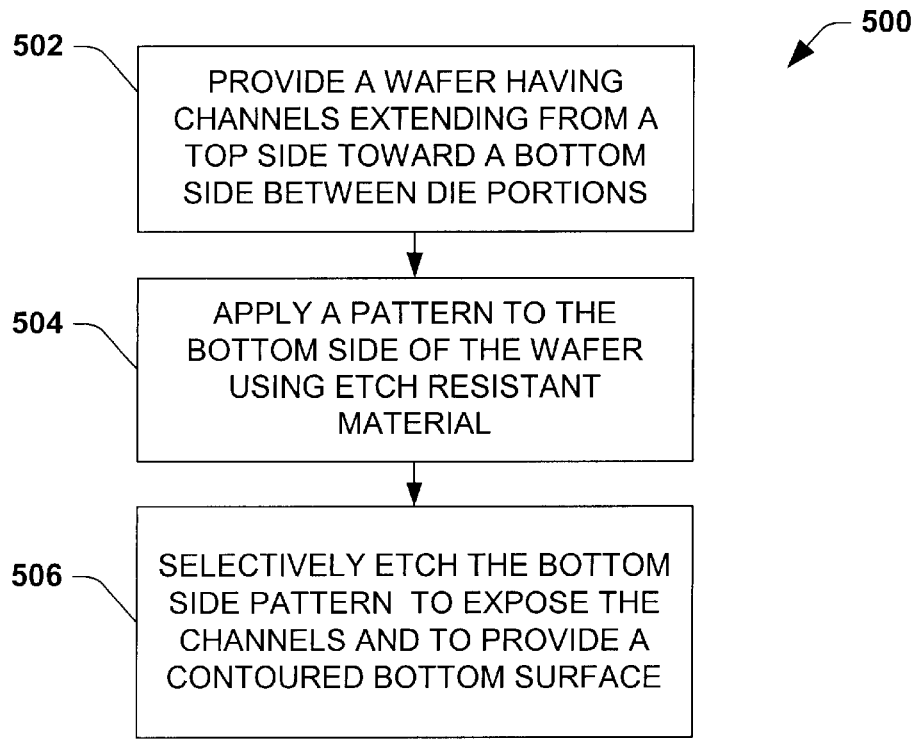
FIG. 25 is a flow diagram illustrating an exemplary method of removing material from the bottom side of a wafer to provide a contoured bottom surface according to another aspect of the invention.

Another aspect of the invention involves creation of a contoured bottom surface on a die or wafer. The contoured surface provides for effective or improved heat convection away from the die in operation, and may further advantageously provide a low slippage interface for ultrasonic and other assembly tooling, so as to mitigate particle generation. Referring now to FIG. 25, another exemplary method 500 for separating wafer dies is illustrated, wherein a wafer is provided at 502 having channels extending from a top side toward a bottom side thereof and between adjacent die portions. The channels can be formed in any appropriate manner, including using the above mentioned directional etching techniques, saw cutting, or other methodologies. At 504, a pattern is applied to the bottom side of the wafer using etch resistance material. Any material may be employed, such as a polymer which can be jetted onto the bottom surface, wherein the etch rate of the polymer is lower than that of the semiconductor wafer. Moreover, the polymer can be applied according to any desired pattern, and the material can be applied in droplets of any size and/or shape.

At 506, the bottom side is selectively etched according to the pattern to provide a contoured bottom surface on all or a portion of the bottom side of the wafer. The bottom-side etch at 506 may further expose the channels so as to separate wafer dies from one another. The selective etching of the bottom side of the wafer at 506 can be performed using a plasma to create the contoured surface, for example, wherein a non-directional plasma etch sacrificially removes material from the wafer bottom side as well as from the pattern of polymer droplets in order to created contoured convex features or shapes on the wafer bottom. For instance, a grid pattern of circular polymer droplets can be employed together with a non-directional plasma etch, in order to provide semispherical convex shapes on the bottom side of the wafer. These shapes can then be used to interface with ultrasonic tooling during assembly, as well as to provide improved convection cooling during operation of the die circuitry. Any shapes and patterns can be used in accordance with the invention, whereby such advantages can be achieved. A further advantage of the various aspects of the present invention is that bumped, front-side etched, contoured back die can be packaged and shipped while still on the film carrier, thus protecting the gold stud bumps from handling damage.

Figure 26:
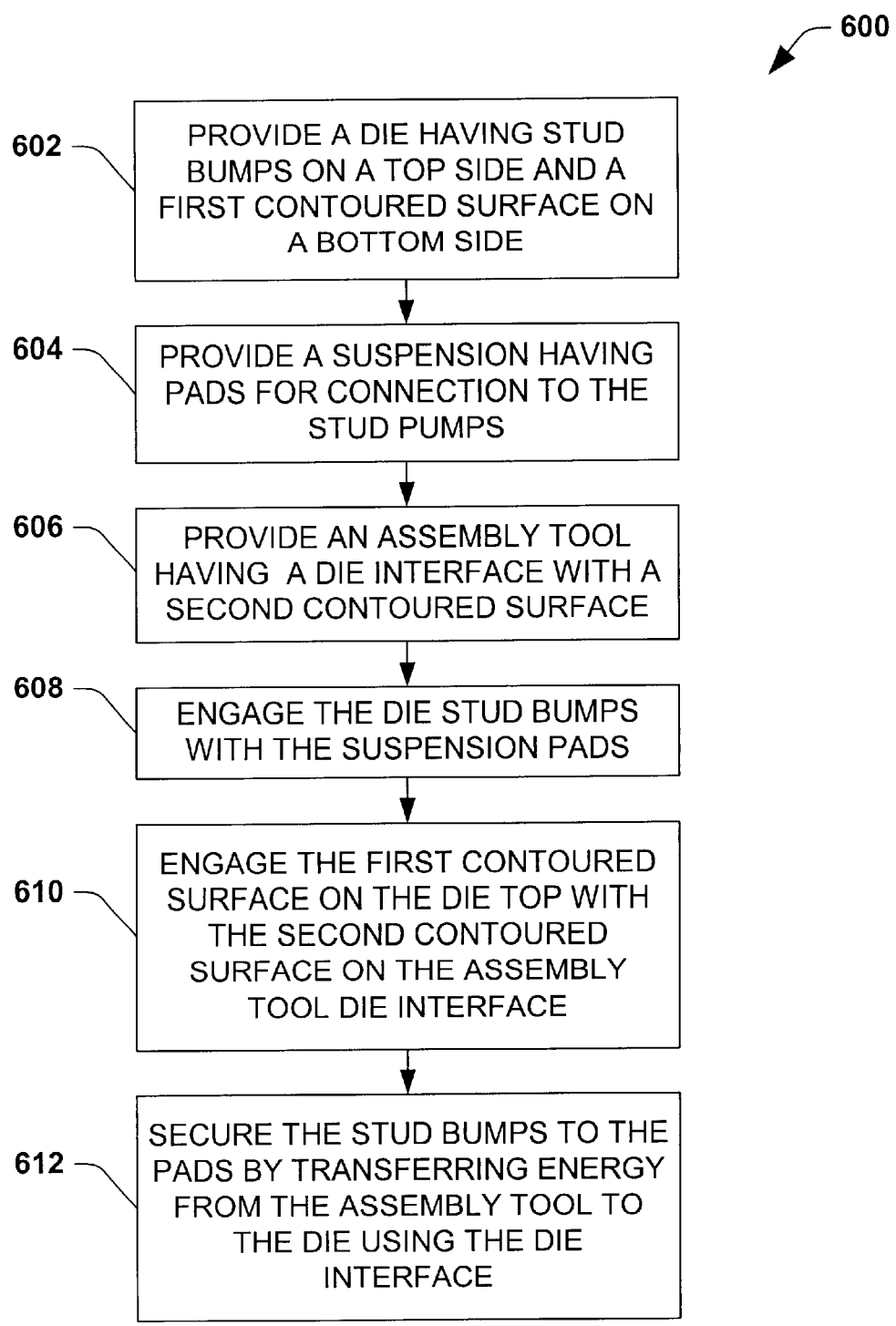
FIG. 26 is a flow diagram illustrating an exemplary method of assembling a semiconductor die to a circuit board in accordance with another aspect of the invention.

Referring now to FIG. 26, another aspect of the invention provides techniques for assembling semiconductor dies into electrical circuits, such as circuit boards, suspensions (e.g., using COS techniques), substrates, flex circuits, or the like. An exemplary method 600 is illustrated in FIG. 26, in which a die is provided at 602 having bumps (e.g., gold stud bumps) on a top side and a first contoured surface on a bottom side. For example, the die 272 of FIGS. 18 and 19 includes stud bumps 230 on top side 206 and the contoured surface 280 on the bottom side 208. At 604, a suspension (e.g., or other circuit board) is provided having pads for connection to the stud bumps. In accordance with the invention, an assembly tool, such as the ultrasonic assembly tool 310 of FIG. 19, is provided having a die interface with a second contoured surface. For instance, the interface 312 of FIG. 19 comprises contoured surface 314.

At 608, the die stud bumps are engaged with the suspension pads, and at 610 the first and second contoured surfaces are engaged. Energy is then transferred from the ultrasonic tool to the die at 612 using the contoured interface, whereby the stud bumps are secured to the suspension pads. The first contoured surface on the die can be provided by any appropriate methodologies, including those illustrated and described above wherein patterned etching is employed. The method 600 provides for assembly of the die to the suspension or circuit while avoiding or mitigating slippage between the ultrasonic tool and the die through the cooperative engagement of the first and second contoured surfaces. The reduction in slipping, in turn, reduces or eliminates particle generation typical in conventional ultrasonic die attachment. The various aspects of the invention, such as channel etching, bottom-side etching to separate dies and to create contoured bottom surfaces, as well as the use of a contoured ultrasonic assembly tool interface may advantageously be combined to provide for substantially particle free fabrication and assembly of semiconductor dies, by which the above mentioned problems associated with such particulate matter can be mitigated or avoided.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of separating dies from a wafer with top and bottom sides and having a plurality of electrical circuits in corresponding die areas of the wafer, the method comprising:

etching channels in the wafer extending into the wafer from the top side toward the exposed bottom side, wherein the channels are located between the die areas of the wafer;

mounting a carrier tape onto the top side of the die areas of the wafer; and removing material from the exposed bottom side of the wafer to expose the channels and separate the dies from one another, wherein removing material from the bottom side of the wafer comprises etching a contoured surface in the bottom side of the wafer, attaching said non contoured surface to a circuit board, leaving said contoured surface exposed.

2. The method of claim 1, wherein etching channels in the wafer comprises removing material from the top side of the wafer using a dry chemical etch process.

3. The method of claim 2, wherein removing material using a dry chemical etch process comprises removing material using a directional plasma etch to create channels having a width of about 15 μm, and a depth of about 130 μm or more and about 200 μm or less.

4. The method of claim 1, wherein etching the channels in the wafer comprises removing material from the top side of the wafer using a reactive ion etching process.

5. The method of claim 4, wherein etching the channels in the wafer comprises providing a channel having a width of about 15 μm, and a depth of about 130 μm or more and about 200 μm or less.

6. The method of claim 4, wherein removing material from the exposed bottom side of the wafer comprises at least one of grinding and etching.

7. The method of claim 1, wherein etching a contoured surface comprises selectively etching the bottom side of the wafer to create the contoured surface.

8. The method of claim 7, wherein selectively etching the bottom side of the wafer comprises:

applying a pattern to the bottom side of the wafer using an etch resistant material; and selectively etching the bottom side pattern using a plasma to create the contoured surface.

9. The method of claim 8, wherein applying a pattern to the bottom side of the wafer comprises jetting polymer droplets in a dot pattern on the bottom side of the wafer.

10. The method of claim 9, wherein the polymer droplets have an etch rate compatible with that of the wafer, and wherein selectively etching the bottom side pattern comprises performing a non-directional etch on the bottom side until the channels are exposed.

11. The method of claim 1, wherein removing material from the bottom side of the wafer comprises at least one of grinding and etching.

12. The method of claim 11, wherein removing material from the bottom side of the wafer comprises etching a contoured surface in the bottom side of the wafer.

13. The method of claim 12, wherein etching a contoured surface comprises selectively etching the bottom side of the wafer to create the contoured surface.

14. The method of claim 13, wherein selectively etching the bottom side of the wafer comprises:

applying a pattern to the bottom side of the wafer using an etch resistant material; and selectively etching the bottom side pattern using a plasma to create the contoured surface.

15. The method of claim 14, wherein applying a pattern to the bottom side of the wafer comprises jetting polymer droplets in a dot pattern on the bottom side of the wafer.

16. A method of separating dies from a wafer with top and bottom sides and having a plurality of electrical circuits in corresponding die areas of the wafer, the method comprising:

etching channels in the wafer extending into the wafer from the top side toward the exposed bottom side, wherein the channels are located between the die areas of the wafer;

mounting a carrier tape onto the top side of the die areas of the wafer; and removing material from the exposed bottom side of the wafer to expose the channels and separate the dies from one another, wherein removing material from the bottom side of the wafer comprises at least one of grinding and etching;

wherein etching a contoured surface comprises selectively etching the bottom side of the wafer to create the contoured surface;

wherein selectively etching the bottom side of the wafer comprises:

applying a pattern to the bottom side of the wafer using an etch resistant material; and selectively etching the bottom side pattern using a plasma to create the contoured surface;

wherein applying a pattern to the bottom side of the wafer comprises jetting polymer droplets in a dot pattern on the bottom side of the wafer; and wherein the polymer droplets have an etch rate compatible with that of the wafer, and wherein selectively etching the bottom side pattern comprises performing a non-directional etch on the bottom side until the channels are exposed.

* * * * *